United States Patent [19]

Lemelson

[11] 4,289,836

[45] Sep. 15, 1981

[54] RECHARGEABLE ELECTRIC BATTERY SYSTEM

[76] Inventor: Jerome H. Lemelson, 85 Rector St., Metuchen, N.J. 08840

[21] Appl. No.: 127,400

[22] Filed: Mar. 5, 1980

[51] Int. Cl.³ .............................................. H01M 2/00
[52] U.S. Cl. ........................................ 429/61; 429/93
[58] Field of Search ................................... 429/90-93, 429/17, 19, 61; 320/2, 48, 49

[56] References Cited

U.S. PATENT DOCUMENTS

| 4,002,805 | 1/1977 | Waldman | 429/19 X |
| 4,055,708 | 10/1977 | Yamamoto | 429/93 X |
| 4,202,933 | 5/1980 | Reiser et al. | 429/13 |

*Primary Examiner*—Charles F. LeFevour

[57] ABSTRACT

A rechargable battery, system and method for controlling its operation and the recharging thereof in order to prolong the useful life of the battery and to optimize its operation. In one form, an electronic microprocessor is provided within or attached to the battery for receiving and processing electrical signals generated by one or more sensors of battery operational variable and for generating output signals which may be employed to control the charge of the battery and to display one or more variables concerned with the battery operation.

15 Claims, 2 Drawing Figures

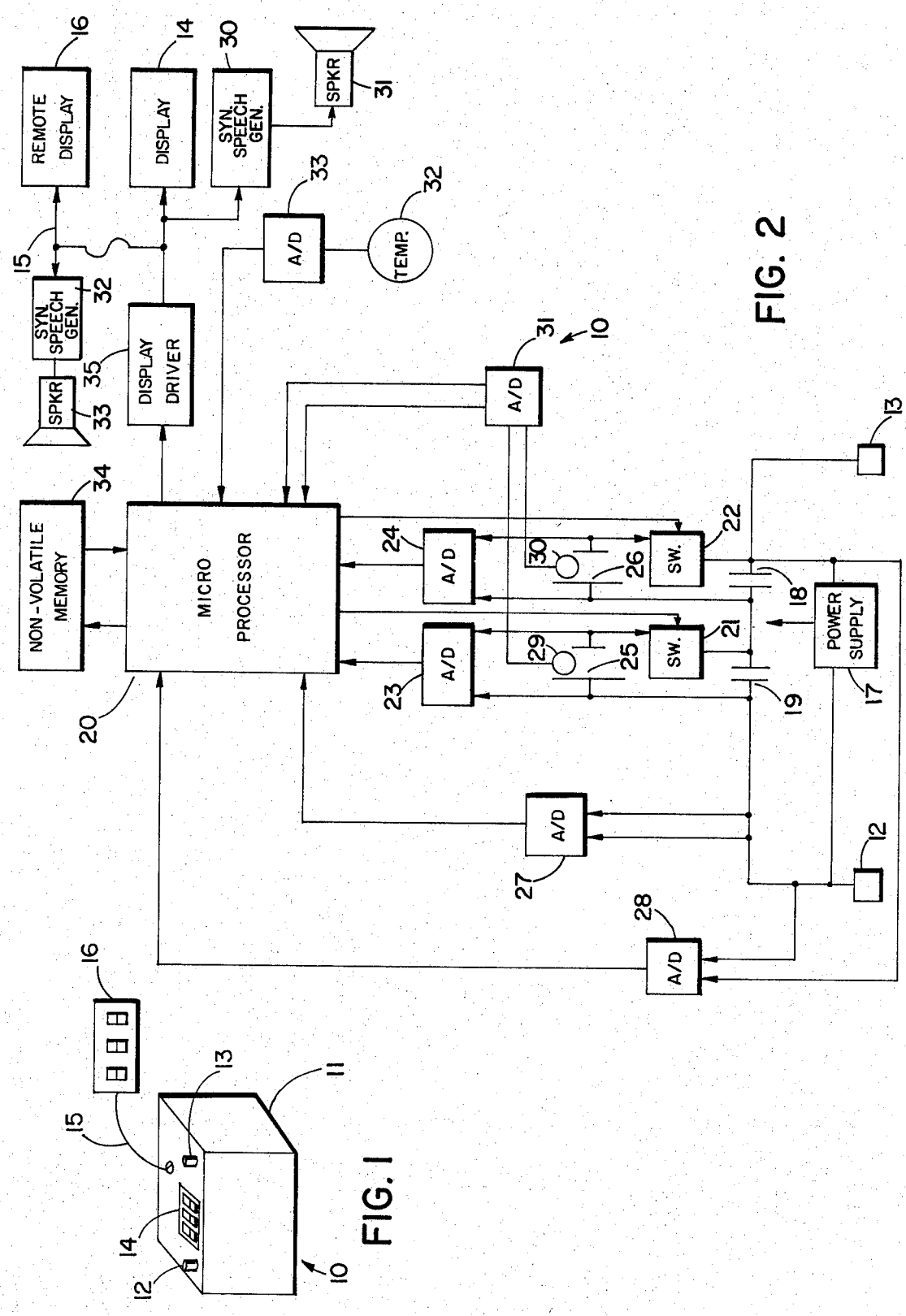

RECHARGEABLE ELECTRIC BATTERY SYSTEM

SUMMARY OF THE INVENTION

This invention relates to a rechargable cell or battery composed of a number of cells, for use in operating one or more electrical devices by means of the current generated by such cell or battery. In particular, the invention employs a computer or microprocessor for processing electrical signals generated by sensors sensing battery variables such as the state of battery charge, number of charging cycles, battery temperature, battery pressure, electrode or cell components condition, or other variable which is indicative of the condition, remaining life and operational characteristic of the battery. By providing an integral microcomputer of electronic microprocessor for processing signals received which are indicative of battery operational variables and component conditions, such computer may be employed to control one or more displays for displaying battery variables and for indicating and controlling at least certain of such variables. An indication of the battery variables at any time may be had by means of an electronic display or number of such displays which are supported within the battery housing or on the exterior wall thereof and are preferably viewable from the exterior of the battery as well as by means of one or more audio devices, such as sound or synthetic speech generating units which are controlled in their operation by signals generated by the microprocessor or computer.

Accordingly it is a primary object of this invention to provide a new and improved rechargable battery and an electronic control system for controlling the operation of such battery, and of displays indicative of the battery condition or operation and the recharging of the battery.

Another object is to provide a simple and relatively inexpensive electronic system for controlling variables associated with a rechargable battery or electrical energy cell of any suitable type, so as to improve its operation.

Another object is to provide a simple system for indicating the condition of a battery, such as a rechargable electric battery and the remaining expected life of the battery.

Another object is to provide a simple electronic system for optimizing the operation of an electric battery.

Another object is to provide a low cost and efficient control system for an electric battery.

With the above and such other objects in view as may hereinafter more fully appear, the invention consists of the novel constructions, combinations and arrangements of parts as will be more fully described and illustrated in the accompanying drawings, but it is to be understood that changes, variations and modifications may be resorted to which fall within the scope of the invention as claimed.

In the drawings:

FIG. 1 is an isometric view of the exterior of a rechargable battery or cell defining the instant invention, and FIG. 2 is a schematic diagram of the components and sub-system electronic circuitry provided within the rechargable battery illustrated in FIG. 1.

In FIG. 1 is shown a rechargable battery defining an energy generating system 10 and including a housing 11 supporting respective input-output battery terminals 12 and 13, a display means 14 such as a bank of numerical display elements of the liquid crystal diode or light emitting diode type. A remote or exterior display 16, preferably of the type defining display 14, is connected by electrical cable 15 to suitable electronic circuitry located within the housing 11, which will be described.

The housing 11 may contain one or a number of electric battery elements or cells of any suitable construction and suitable electrolyte or chemical disposed in any suitable manner therein for reacting with respect to electrode material or other chemical to generate electricity across the terminals 12 and 13. The housing 11 may also contain one or more suitable fuel cells for generating electricity when a fuel is burned or otherwise consumed therein.

In FIG. 2 typical electronic components of the system 10 for controlling the operation of the battery, are illustrated. If the battery is initially in a discharged condition, charging current from an external source of current, is provided across the terminals 12 and 13, from any suitable source such as a power supply 17 operable to regulate such current and to provide the proper operational voltages for properly operating the electronic components of the system 10. Such charging current is also applied to a pair of capacitors 18 and 19, which are charged.

An electronic microcomputer or microprocessor 20 is also connedted to receive operational power from the power supply 17, which current is also applied to toggle a pair of bidirectional switches 21 and 22 at a rate which is determined by the signal output of respective analog-to-digital converters 23 and 24, which sense the voltage drop across respective cells 25 and 26 of the battery.

Actual current flow and direction are indicated by the output of an analog-to-digital converter 27, the input to which is connected across a short length of conductor or bus extending from the battery terminal 12.

The rate of charge to the battery is adjusted by the toggling rate of switches 21 and 22, which action serves to optimize the efficiency of a number of charges applied to the cells 25 and 26.

When the battery is fully charged a load may be applied to the terminals 12 and 13, as in the operation of any conventional battery and the stored energy may be thereby utilized. In such mode of operation the microprocessor 20 senses the output voltage at the terminals 12 and 13 as digital signals generated by an analog-to-digital converter 28. The microprocessor also senses or receives signals indicative of current drain from the analog-to-digital converter 27 and indications of voltage across the cells 25 and 26 as signals generated on the outputs of respective analog-to-digital converters 23 and 24. The chemical or ionic content of each cell is also indicated by employing a plurality of chemical composition sensors, such as pH proves 29 and 30, which are connected to an analog-to-digital converter 31, the outputs of which extend to respective inputs of the microprocessor 20 for supplying such information sensed thereby, in digital form. The microprocessor 20, after processing the signals received, regulates the toggling rate of switches 21 and 22, each of which controls the drain of a respective of the cells 25 and 26, according to the current demand and the cell needs for optimizing the discharge of the cell. Such cell drain is accomodated by respective capacitors 18 and 19, thereby controlling the current supplied to the external load.

System 20 also contains a means whereby each charge-discharge cycle may be recorded, and an electronic means for calculating the remaining charge and/or remaining number of charge-discharge cycles and for effecting the display of such information. Each charging cycle is recorded in a memory 34, as signals generated on an output of the microprocessor 20, in accordance with signals received from the analog-to-digital converter 27 as well as information signals which are indicative of the chemical content of the cells and/or other cell variables which are sensed as previously described. Such information in the memory 34 is output to the microprocessor 20, which generates signals for operating a display driver 35 which, in turn, controls the operation of the digital display 14, such as a bank of LCD or LED numerical display units so as to display information indicative of the condition of the battery. Also included is provision for the remote display of the information so generated. A display driver 35 is connected to receive control signals from the microprocessor 20 and is operable to drive one or both of the display 14 and a remote display 16 with signals generated on the output cable 15.

Also provided in FIG. 2 is a temperature sensor 32 or a group of such sensors, suitably located within the battery housing or cells thereof for sensing battery temperature, the output signals of which sensor are passed in an analog-to-digital converter 33 which is connected to an input to the microprocessor and which provides signals indicative of temperature for processing by the microprocessor. Similarly, other battery variables such as pressure, degree of corrosion, internal resistence, condition of components of the cells of the battery, etc., may be sensed and indicated by respective sensors suitably located within the battery or its components and each preferably connected to an analog-to-digital converter as well as suitable amplifying means, to generate signals which may be processed by the microprocessor 20 and utilized to permit the microprocessor to generate control signals of the types described.

By using a control system of the type illustrated in FIG. 2, battery operation and life may be optimized and controlled to maximize the life of the battery and prevent improper or destructive operation thereof.

All of the components illustrated in FIG. 2, as well as other components which may be added thereto, may be powered by electrical energy generated by the battery itself.

Modifications to the system are noted as follows:

The microcomputer or microprocessor 20 may be constructed to generate a warning signal or signals in accordance with signals received thereby from any or a number of the inputs provided in FIG. 2, wherein such warning signal or signals may be indicative of such possible battery operating characteristics as (a) one in which battery or cell temperature is approaching or exceeding a predetermined degree as an indication of battery malfunction or overloading or environmental ambient temperature which may adversely affect its operation, (b) battery overloading due to excessive demands for current thereon, (c) excessive internal pressure in a cell or cells of the battery as sensed by one or more pressure sensors properly located within the battery housing or cell, (d) approach of a discharged state as indicated by the signals generated on the outputs of the analog-to-digital converters 27 and 28 or by a counting circuit provided in the microcomputer 20 which counts each charge or signals generated as the battery discharges, (e) conditions such as the falling of the level of battery electrolyte as sensed by a liquid level sensor provided in each cell of the battery which operates per se when the level falls below a predtermined level or other variable.

Such signal or signals generated by the microprocessor 20 may be applied to drive one of the displays shown, auxilliary displays, a sound generating transducer and/or a short wave generator of a signal code for generating a short wave transmitting information to a remote receiver, which information is indicative of to condition or approaching condition sensed or otherwise indicated as described. If a number of such batteries or cells are provided to generate electricity for a system, each battery or cell may be provided with a short wave or line generating code generator adapted to generate a different code than the other batteries or cells such that, when a code so generated by a particular cell or battery is remotely received, it may be used to provide a remote indication of which cell or battery in the system is experiencong or about to experience faulty operation or about to become fully discharged.

If each function sensed is indicated by a respective output of the microprocessor 20 and such outputs are connected to different code generators each operable to generate a different code than the others, then the particular condition so indicated or sensed may be remotely indicated by employing the codes so generated and transmitted to activate different indicators or to activate a display, such as one of those shown in FIGS. 1 and 2 or a remote display receiving information transmitted thereto by short wave, in a manner to indicate the particular condition sensed and, in certain applications, the cell or battery experiencing or approaching such condition or conditions.

It should be understood with respect to the embodiments illustrated and described above, that suitable power or power supplies having the correct polarities and magnitudes, where not indicated in the drawings, are provided to supply proper electrical energy for appropriately operating the various illustrated circuits and components described.

In a particular modification to the invention, the code signals described for indicating particular battery or cell conditions or the battery or cell which is experiencing faulty operation, may be employed to selectively activate a synthetic speech signal generator, supported either by the battery or remote therefrom and operable to drive a speaker to generate synthetic speech sounds of words indicating the particular battery condition sensed or being approached.

In FIG. 2, signals generated on the output of the display driver 35 are applied, in addition to drive the displays 14 and 16, to respective synthetic speech signal generators 30 and 32, the former being located locally with respect to the battery and the latter remotely therefrom. Respective speakers 31 and 33 are connected to convert the synthetic speech signal outputs of the synthetic speech signal generator to sounds of words indicating the battery condition sensed.

I claim:

1. A rechargeable electric storage battery and a control system therefor comprising in combination:
a rechargeable cell for generating electricity,
a source of recharging electrical energy,
control means for controlling the flow of electrical energy to recharge said electric battery,
first means for sensing an operating condition of said cell, second means for generating electrical signals indicative of the condition of said cell, third means for receiving said electrical signals generated by said second means, fourth means for processing said electrical signals received by said third means and generating digital signals, fifth means including an electronic computer for receiving said digital electrical signals, analyzing same and generating control signals, and means for applying said control signals for operating said control means to control the flow of electrical energy to said cell for charging said rechargeable cell.

2. A rechargeable battery and control system in accordance with claim 1 wherein said fourth and fifth means comprise a single computer.

3. A rechargeable battery and control system in accordance with claim 2 wherein said first means is operable to sense the discharge condition of said cell.

4. A rechargeable battery and control system in accordance with claim 1 wherein said computer comprises an electronic microprocessor.

5. A rechargeable battery and control system in accordance with claim 4 wherein said cell defines at least part of an electric battery defined by a battery housing, said electronic microprocessor being supported by said battery housing, further including electronic display means supported by said housing and operable by said microprocessor to display the condition of said battery.

6. A rechargeable battery and control system in accordance with claim 1 wherein said first means is operable to sense discharging of said cell, said fifth means being operable for summing signals generated by said fourth means and thereby determining the degree said cell has discharged and to control the charging of said rechargeable cell.

7. A rechargeable battery in accordance with claim 6 including means for recording the number of times said cell undergoes a recharging cycle and indicating when a predetermined number of charging cycles have been experienced by said cell.

8. A rechargeable battery in accordance with claim 1 including a visual display means for receiving control signals generated by said fifth means and responsive to said control signals for displaying a condition of said battery.

9. A rechargeable battery in accordance with claim 8 wherein said visual display means is operable to display the discharge condition of said battery.

10. A rechargeable battery in accordance with claim 8 wherein said visual display means is viewable from the exterior of said battery.

11. A rechargeable battery and control system in accordance with claim 1 including means situated remote from said battery for indicating the conditon of said battery, further including sixth means for transmitting signals generated by said fifth means to said remote indicating means for controlling same to indicate a condition of said battery.

12. A rechargeable battery in accordance with claim 1 wherein the electrical signals generated by said first means are analog signals, said fourth means comprising analog-to-digital conversion means for converting said analog signals to digital signals and said fifth means is operable to compare said digital signals with recordings provided in a memory.

13. A rechargeable battery in accordance with claim 1 wherein said first means is operable to sense a plurality of battery variables selected from the group of variables including battery internal resistence, temperature, pressure, state of charge, cell condition and level of battery electrolyte.

14. A rechargeable battery in accordance with claim 1 including a synthetic speech signal generating means controlled by said electronic computer for generating speech signals indicative of the condition sensed and means for converting such speech signals to sounds of words indicating such condition.

15. A rechargeable battery in accordance with claim 14 wherein said means for converting said synthetic speech signals to sounds of words indicative of the battery condition sensed is located remote from said battery.

* * * * *